United States Patent
Dommerque et al.

(10) Patent No.: US 8,264,802 B2
(45) Date of Patent: Sep. 11, 2012

(54) CURRENT LIMITING DEVICE

(75) Inventors: Robert Dommerque, Brühl (DE); Sergej Bemert, Moscow (RU); Walter Heribert, Stadtbergen (DE); Christian Frohne, Hannover (DE)

(73) Assignee: Nexans, Paris (FR)

( * ) Notice: Subject to any disclaimer, the term of this patent is extended or adjusted under 35 U.S.C. 154(b) by 524 days.

(21) Appl. No.: 12/489,051

(22) Filed: Jun. 22, 2009

(65) Prior Publication Data

US 2010/0157499 A1 Jun. 24, 2010

(30) Foreign Application Priority Data

Jun. 27, 2008 (EP) .................................... 08305352

(51) Int. Cl.
*H02H 7/00* (2006.01)
(52) U.S. Cl. ......................................................... 361/19
(58) Field of Classification Search ...................... 361/19
See application file for complete search history.

(56) References Cited

U.S. PATENT DOCUMENTS

| 5,986,536 A | 11/1999 | Ries et al. |
| 7,444,826 B2 * | 11/2008 | Sargent et al. ............... 62/259.2 |
| 2003/0154734 A1 | 8/2003 | Paul et al. |
| 2006/0072254 A1 | 4/2006 | Sargent et al. |
| 2007/0204632 A1 | 9/2007 | Lee |

FOREIGN PATENT DOCUMENTS

JP 4193024 7/1992

OTHER PUBLICATIONS

International Search Report dated Oct. 6, 2008.

* cited by examiner

*Primary Examiner* — Stephen W Jackson
(74) *Attorney, Agent, or Firm* — Sofer & Haroun, LLP

(57) ABSTRACT

A modular design of a fault current limiter includes one ore more current limiting units 1 with one or more superconducting elements 2 and where standardized current limiting units 1 and standardized modular insulation housings 10 can be used for modular design of a fault current limiter.

13 Claims, 2 Drawing Sheets

CURRENT LIMITING DEVICE

RELATED APPLICATION

This applications claims the benefit of priority from European Patent Application No. 08 305 352.0, filed on Jun. 27, 2008, the entirety of which is incorporated by reference.

BACKGROUND

1. Field of the Invention

The present invention relates to an improved arrangement of superconducting elements in a current limiting device in particularly optimized for high voltage applications. Further, the present invention relates to such a current limiting device which can be easily adapted to the particular requirements of a specific application such as specific voltage level of said application etc.

2. Description of Related Art

Superconductors offer a great potential as resistive fault current limiters which enable rapid and effective current limitation, automatic recovery and negligible impedance during normal operation. They are especially an enabling technology for other superconducting applications in the high voltage technology, for example superconducting cables.

Typically a superconducting fault current limiter comprises one or more superconducting elements housed in an insulating housing such as a cryostat, filled with a cooling medium for cooling the superconducting elements below their critical temperature Tc at which they exhibit superconducting properties.

The critical temperature depends on the specific superconducting material. Suitable cooling mediums are for example nitrogen, helium, neon, hydrogen or mixtures thereof in their liquid state.

Preferred superconducting materials are the high temperature superconductors such as BSCCO (bismuth-strontium-calcium-copper-oxide) and YBCO (yttrium-barium-copper-oxide) which have a critical temperature in the range of 67 K and 110 K.

Thus, for these materials liquid nitrogen can be used as cooling medium which is preferred in view of costs.

In the design of a fault current limiter two particular parameters must be taken in consideration.

The first parameter is the nominal current at which the system will be operated as well as the limitation level at which the system shall limit the current.

That is, the superconducting elements must be selected in view of their current carrying capacity as well as in view of their limitation properties.

In order to meet these requirements either one superconducting element or two or more superconducting elements electrically connected in parallel, may be necessary.

The second parameter is the voltage level at which the current limiter shall be operated. By the voltage level the necessary number of superconducting elements which have to be electrically connected in series is determined.

In order to meet these parameters for any specific application a fault current limiter has to be individually designed. Thus, there is a need for a standardized design which allows easy adaption of a fault current limiter to the specific requirements of the respective application.

Further, in a fault current limiter which is to be operated at middle or high voltage level, voltages up to several 100 kV can occur. For avoiding any damage it is necessary that even at such extreme voltage peaks no flash over takes place between the individual structural elements of the current limiter, for example between the superconducting element(s) and the jacket of the cryostat housing, which typically is grounded.

Liquid nitrogen, typically used as cooling medium, also has very good insulation properties and, thus, helps to provide electrical insulation within the fault current limiter.

However, there is a problem, that in fault event the superconducting element(s) are thermally heated up to temperatures exceeding the boiling temperature of the surrounding liquid nitrogen. In the result gaseous nitrogen, that is gas bubbles, are formed within the cryostat. However the electric insulation properties of gaseous nitrogen is significantly less than that of liquid nitrogen. In addition gaseous nitrogen not only has a less break through strength than liquid nitrogen but also leads to reduction, of the electrical field in regions, where the liquid nitrogen is displaced by the gas bubbles, both factors enhancing the risk of flash over. Consequently, for avoiding voltage flash over the distances between the structural elements in the cryostat must be selected greater as would be the case of liquid nitrogen.

Consequently, the required space for the fault current limiter is enhanced.

US 2007/0204632 A1 and JP 04193024 A1 relate to a fault current limiter wherein a first closed cooling bath including the superconducting element is housed within a second closed cooling bath, wherein the pressure exerted onto the first cooling bath is higher than that exerted onto the surrounding second cooling bath for suppressing bubble formation within the first cooling bath on temperature raise.

Also WO 2005/006455 A1 relates to the problem of dissipation of thermal energy from the cooling bath surrounding superconducting elements. To this two separate cooling circuits are provided which are thermally coupled by a heat exchanger. The first cooling circuit serves to cool the superconductor elements. Heat generated is conducted away via the heat exchanger to the second cooling circuit which, in turn, is thermally coupled by a heat exchanger to surroundings for conducting away the heat to the surroundings.

In the first cooling bath liquid Neon (~27K) and in the second cooling bath liquid Nitrogen (~77K) is used.

Also EP 1 217 708 A1 relates to a fault current limiter with a first cooling bath for cooling the superconducting elements and a second cooling bath for dissipating heat of the first cooling bath in case of temperature raise.

The second cooling bath serves as a cooling reservoir with a medium having a lower boiling point than the medium of the first cooling bath.

Both bathes and, consequently, the superconductor arrangement are cooled down to a temperature lower than the boiling point of the second cooling bath. In case of temperature raise there is a temperature puffer resulting from the difference in boiling temperature of the bathes.

DE 195 20 205 A1 relates to a known fault current limiter wherein a plurality of plate-shaped limiting elements are connected in series and are immersed into a cryostat 20 filed with cooling medium. Vaporized cooling medium K1 is discharged to a cooling devise 21 for liquefying and provided to the cryostat 20 as liquid cooling medium K2.

However there is still a need for a fault current limiter applying superconducting elements having a space saving arrangement suitable for high voltage application and which can be, nevertheless, safely operated.

Further, there was a demand for a fault current limiter design which can be easily adapted to the specific requirements and condictions of different applications.

OBJECTS AND SUMMARY

According to the present invention this problem is solved by a fault current limiter comprising at least one current limiting unit, wherein the current limiting unit is arranged in the interior of an insulation housing and wherein the current limiting unit comprises one or more superconducting elements, wherein the current limiting unit forms a casing which spatially separate the superconducting elements from the surrounding interior of the insulation housing and wherein the fault current limiter comprises a first cooling medium circuit for cooling the superconducting elements within the current limiting unit and a second cooling medium circuit for supplying the surrounding interior of the insulating housing.

Further, the present invention relates to a current limiting unit encasing one or more superconducting elements and the use of such current limiting unit for the modular design of a fault current limiter.

In a first aspect the present invention is based on the separation of the necessary cooling of the superconducting elements within a fault current limiter and the insulation material necessary for high voltage insulation.

In addition in the design of the present invention there is no need to keep the first and second cooling medium under different surrounding conditions, e.g. different pressure, requiring additional equipment.

In a second aspect the present invention relates to a fault current limiter which can be variably designed by standardized current limiting units and modules allowing easy adaptation and design, respectively, of a fault current limiter for the specific requirements of different applications.

For the present invention, in principle, any superconducting element suitable for fault current limiting application can be used.

Preferably, the superconducting element is made of a high temperature superconducting material, such as mentioned above.

Further, the shape of the superconducting element is not particularly restricted provided that it is suitable for the use in a fault current limiter.

Preferably, the superconducting element can be composed of a bulk material, for example, superconducting elements obtainable by a sintering or melt casting method.

Further, the superconducting element can be composed of a superconducting layer deposited onto a substrate, for example such as known as coated conductors wherein a thin-film of superconductor material is provided onto a substrate, typically made of metal, by physical vapor deposition, chemical vapor deposition or chemical solution deposition etc.

Preferably, the superconducting element has a cylindrical shape, such as a rod, tube or coil, or a plate shape.

According to the present invention the superconducting element(s) are arranged within a current limiting unit which spatially separates the superconducting element(s) from the surrounding, typically the interior of an insulation housing such as a cryostat.

Further, a current supply is provided for connecting the superconducting elements within the current liming unit to the grid.

According to the present invention the current supply is simultaneously used for feeding and discharging cooling medium to the current limiting unit.

To this, the current supply has a hollow interior such as a tube. The current supply extends through the current limiting unit into the interior of the current limiting unit to the superconducting elements.

For allowing exchange of the cooling medium to and from the interior of the current limiting unit at the end portion of the current supply which is within the current limiting unit, an opening is provided.

Consequently, according to the present invention the current supplies 6a, b form part of the first cooling medium circuit which serves to cool the superconducting elements.

Typically, the superconducting element is connected to a current supply at its opposing ends:

The superconducting element(s) present within the current limiting unit can be arranged within a holder.

In case of two or more superconducting elements, preferably, the holder is suited to connect the superconducting elements electrically in parallel with each other. Simultaneously, by the holder the arrangement of superconducting elements electrically connected in parallel are connected electrically in serious within the system.

The casing of the fault current limiting unit of the present invention can be formed by an electrically non conductive material.

According to a preferred embodiment the casing is formed of a shielding electrode surrounding the superconducting elements with open faces, if any, being closed by an electrically non conductive cover or similar. The outer surface of the current limiting unit is essentially smooth and has an essentially round shape without square etches and spikes for avoiding accumulation of electrical charge which would promote flash over.

Preferably, within a current limiting unit the superconducting elements are substantially equal to each other.

The current limiting unit of the present invention can be used as a standardized component for designing a standardized fault current limiter which can be easily adapted to the specific requirements of an intended application by varying the numbers of standardized current limiting units within the cryostat.

To this, according to need, a number of current limiting units are arranged within a cryostat and are connected electrically in series, for example, by the current supply connected to the individual current limiting units.

By the current limiting units of the present invention standardized components for the design of a fault current limiter are provided which allows not only a great but also a easy variation in the production of fault current limiters.

Further, in fault event, gaseous cooling medium appears only within the current limiting unit, which spatially separates the superconducting elements from the surrounding interior of the insulation housing. Thus, escape of any gas bubbles into the surrounding interior of the insulation housing is prevented.

Since there are no gas bubbles within the surrounding interior of the insulation housing the insulation properties of the cooling medium, such as nitrogen, is not affected. Consequently in the design of the fault current limiter enhanced required space due to any decrease of insulation property must not be taken into consideration. Thus, the overall dimensions of the fault current limiter can be reduced compared to a conventional fault current limiter with occurrence of gas bubbles over the whole volume.

For supplying the surrounding interior of the insulation housing with cooling medium (second cooling medium circuit) any conventional supply system can be used which is generally known in the art.

Moreover, in the present fault current limiter, both the first and second cooling medium can be kept at equal pressure, e.g. ambient pressure and do not require different temperatures for safe operation, which simplifies the design.

BRIEF DESCRIPTION OF THE DRAWINGS

In the following the present invention is explained in further detail by reference to preferred embodiments shown in the figures.

It is shown in

DETAILED DESCRIPTION

Figure 1:
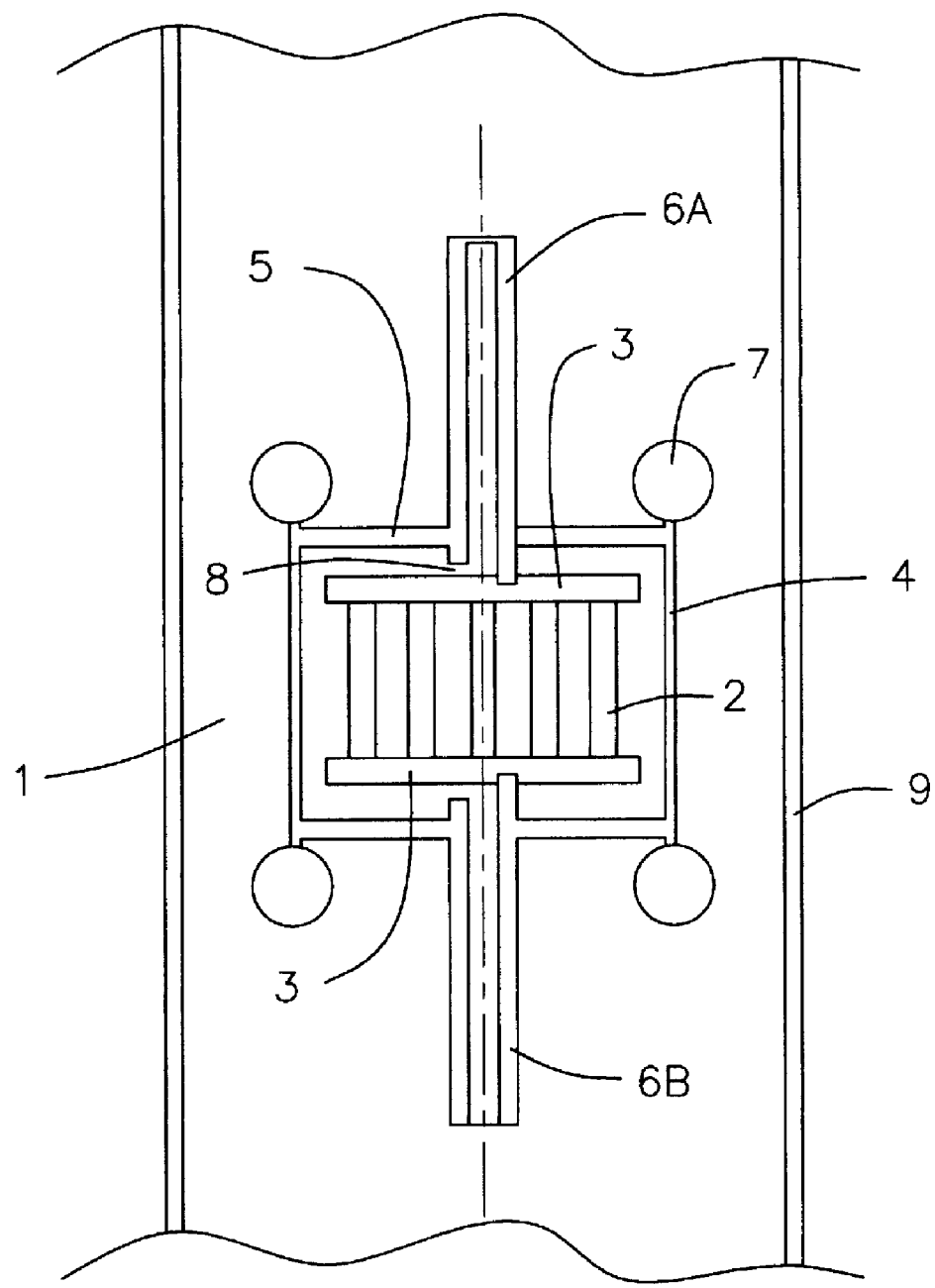
FIG. 1 schematically a longitudinal section of an embodiment of the current limiting unit of the present invention.

In the current limiting unit 1 shown in FIG. 1 a plurality of superconducting elements 2 are arranged in parallel, within a holder 3.

The holder 3 with the superconducting elements 2 is surrounded by shielding electrode 4 enclosing the superconducting elements 2 laterally and forming the bottom. By providing an upper cover 5 a casing is formed which is almost closed and which comprises the holder 3 with the superconducting elements 2.

The shielding electrode 4 can be formed of a sheet of an electrically conductive material such as a metal. Shielding electrodes and manufacturing thereof are in principle known. The shielding electrode 4 with the cover 5 forms a casing with at least the outer surface having an almost cylindrical shape.

The lower and upper etch of the cylindrical body can be rounded by providing for example a tube 7 of electrically conductive material running along the circumference. Preferably, the tube 7, also referred to "toroid", is made of the same material than the shielding electrode 4.

By the essentially cylindrical outer surface shape as well as by the provision of the toroids an essential rounded outer surface can be provided avoiding formation of square etches.

For electrical connection tubular current supply tubes 6a, 6b are provided made of electrically conductive material, which are in electrical connection with the holder 3.

The current supply tubes 6a, 6b simultaneously serve to supply and discharge cooling medium into the current limiting unit 1. To this, each of the tubes 6a and 6b has an opening 8 in its end portion extending between the bottom plate and top cover 5, respectively, and the holder 3.

By means of the openings 8 the hollow interior of the supply tubes 6a, 6b and the chamber formed by the shielding electrode 4 and the cover 5 are in intercommunication.

Each end of the same side of the superconductor elements 2 is held by holder 3. Holder 3 can be composed by an upper and an lower plate or stripe for holding the respective ends of the superconductor elements 2.

The holder 3 can have the shape of a stripe or plate which is designed to hold the respective ends of the superconducting elements. To this, depressions can be provided in the holder having a shape fitting to the shape of the ends of the superconducting elements. The ends of the superconducting elements can be fixed to the holder, for example by soldering or similar.

Further, the portions holding the ends can be designed to act as a clamping bush. The design of suitable holders is generally known in the field of fault current limiters using superconducting elements.

Preferably the holder 3 is designed to connect the individual superconducting elements 2 electrically in parallel and, simultaneously, to electrically connect the individual superconducting elements 2 with the supply tubes 6a and 6b, respectively. To this, holder 3, or at least respective parts of holder 3, are made of electrically conductive material, such as a metal or metal alloy.

In the bottom plate and cover 5 an opening is provided for allowing the passage of the supply tubes 6a and 6b, respectively.

Preferably, the passage of the supply tubes through the opening is leak prove for avoiding leaking of the cooling medium or gas bubbles to the surrounding. According to need a suitable sealing can be provided.

According to the present invention any gas bubbles formed in fault current event are entrapped within the current limiting unit 1 and can leave the unit only via openings 8 within supply tubes 6a, b.

The overall current limiting unit is housed in an insulation housing indicated by reference number 9, such as a cryostat.

In the embodiment shown in FIG. 1 the superconducting elements 2 preferably have an elongated shape such as a tape, tube, rod or similar.

Preferably, superconducting elements 2 within a unit 1 are almost identical.

The maximal electrical voltage, which can occur within the unit, corresponds to the voltage drop along the superconducting elements 2 and is generated between the superconducting elements 2 and the shielding electrode 4. The electrical overall potential of the unit is relieved over the distance between the unit and any adjacent conductive component such as, for example, further units or the grounded insulation housing.

Since in the region between the unit and the jacket of the insulation housing (also referred to "surrounding interior") no gas bubbles are formed or present, the insulation effect of the cooling medium remains unchanged, and is not reduced. In the result the distances which must be kept are significantly lower than in case that formation of gas bubbles has to be considered.

Due to the fact that between this region and the interior of the unit 1 no or essentially no gas or liquid exchange is possible the interior of the insulation housing is provided with a homogeneous insulation material, such as liquid nitrogen. Since no formation of gas bubbles must be considered in the design of the fault current limiter a compact space saving arrangement is possible.

Due to the provision of two different circuits for the cooling medium the design suitable for high voltage can be simplified.

Further, the voltage to be expected within the unit is only small since the length of the superconducting elements is limited and the shielding electrode 4 has the same potential as one end of the superconducting elements.

Consequently, according to the present invention due to the only low voltage drop within the unit and the different circuits of the cooling medium for the unit and the surrounding interior of the insulation housing the necessary dimensions in current limiter design can be significantly reduced, even for high voltage application, thus making possible the construction of a compact space keeping current limiting device.

The current limiting units of the present invention can be advantageously used in the design of a standardized modular current limiting device which is adapted to the specific requirements of an application.

Figure 2:
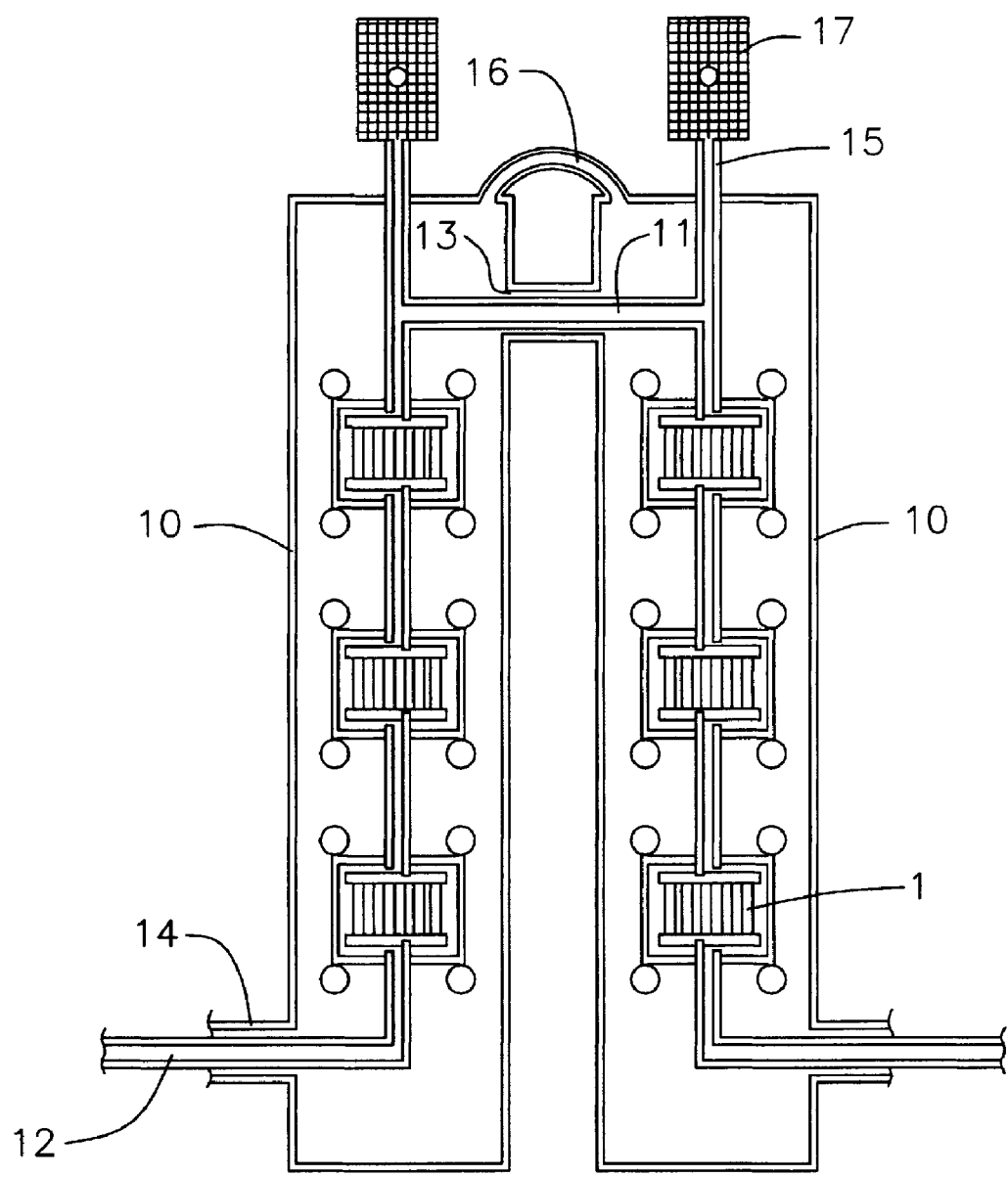
FIG. 2 schematically a longitudinal section of a modular assembly of a plurality of current limiting units of the present invention.

An example of such standardized modular current limiting device is shown in FIG. 2 wherein a plurality of current limiting units of the present invention are combined to form the desired current limiting device.

The individual current limiting units are connected electrically in series by the supply tubes 6a, b which, simultaneously, serve to provide cooling medium to the interior of the current limiting units.

In the embodiment shown in FIG. 2 two insulation housings 10 (in the following also referred to "modular insulation housing") are coupled to each other via an upper docking site 13.

The insulation housings 10 shown in FIG. 2 also comprise lower dockings sites 14 for coupling to further modular insulation housings (not shown).

The current limiting units in each insulation housing 10 are electrically connected by upper and lower electrical connection 11 and 12. Electrical connections 11 and 12, as the current supply 6 a, b, preferably have tubular shape for allowing communication of the cooling medium for the current limiting unit.

Upper and lower electrical connection 12 are connected to current supply 6 a and 6 b.

As shown in FIG. 2, for electrically connecting individual modular insulation housings 10 electrically in series, upper electrical connection 11 is connected to the upper end current supply 6 a of the upper end current limiting units of each of the insulation housings 10 coupled via upper docking site 13 and lower electrical connection 12 is connected to the lower end current supply 6 b of the lower end current limiting units of each of the insulation housings 10 coupled via lower docking site 14 (in FIG. 2 the further insulation housings coupled via lower docking site 12 are not shown).

The individual modular insulation housings 10, form standardized modular components with the number being arranged in series being chosen according to need.

In the endmost module 10 the free electrical connection 11 or 12 (that is the electrical connection 11 or 12 which is not connected to a further module) can be used to connect the arrangement to an external grid. To this, the respective docking site is tightly closed by a suitable, preferably releasable, closure.

Alternatively, the endmost module can be modified by omitting the free electrical connection 11 and 12 and the respective docking sites and electrically connecting the arrangement to an external grid via the current supply 6 a and 6 b respectively, at the end of the series of modules 10 (free current supply).

For discharging the gaseous cooling medium, i. e. the gas bubbles, from the first cooling circuit at least one discharge conduit 15 can be provided. The at least one discharge conduit 15 can be connected to the first cooling medium circuit at any suitable position.

Preferably the discharge conduit is provided at a position on top of the first cooling medium circuit as shown in FIG. 2.

According to FIG. 2 each modular insulation housing 10 is provided with a discharge conduit 15 wherein the discharge conduit 15 is connected to the upper end of the topmost supply 6a. Since the discharge conduit 15 is provided in a top position rising gas bubbles can be easily discharged. The discharge conduit 15 is made of an electrically non conductive material.

Outside of the modular insulation housing 10 the discharge conduit 15 is provided with an outlet 17 such as a valve or the like, which allows escape of the gaseous cooling medium but prevents access from the outside into the first cooling circuit.

Cooling medium can be, for example supplied to the first cooling medium circuit via electrical connection 12, 13 at any free end or via discharge conduit 15.

As shown in FIG. 2 the top level of the liquid cooling medium within the cryostat housing 10 shall extend at least to the upper end of upper docking site 13 to ensure cooling of the docket site and the electrical connection therein.

The interior of adjacent modules 10 can be linked via a compensation tube 14 allowing compensation of liquid, pressure etc. between the individual modules 10.

There is no particular limitation of the number of modules 10 which can be coupled to each other. Thus, it is possible to couple as much modules 10 to each other as is required for a specific application, for example in view of voltage level.

A further advantage of the present invention is that the junction from one module 10 to the adjacent module 10 via the docking sites 13, 14 allows connection in the cooled state. Thus, any loss of thermal energy is avoided as occurs in cases wherein successive insulation housings are connected via a warm connection extending outside the cooled interior.

The present design of current limiting units and modules which can be standardized, offers a great variability in the production of current limiting devices due to the possible standardized modular construction.

The invention claimed is:

1. Fault current limiter comprising:
   at least one current limiting unit, wherein the current limiting unit is arranged within the interior of an insulation housing and wherein the current limiting unit including one or more superconducting elements, where the current limiting unit forms a casing which spatially separate the superconducting elements from the surrounding interior of the insulation housing and where the fault current limiter unit includes a first cooling medium circuit for cooling the superconducting elements within the current limiting unit and a second cooling medium circuit for supplying the surrounding interior of the insulation housing, wherein the one or more superconducting elements are electrically connected to current supply tubes which serve to feed and discharge cooling medium to the fault current limiting unit.

2. Fault current limiter according to claim 1, wherein the casing of the current limiting unit is formed by a shielding electrode with an optionally left open face being closed by a cover.

3. Fault current limiter according to claim 1, wherein the individual superconducting elements are held by a holder.

4. Fault current limiter according to claim 3, wherein the individual superconducting elements within the current limiting unit are connected electrically in parallel.

5. Fault current limiter according to claim 1, wherein the current limiting units within the insulation housing are connected electrically in series by the current supply tubes.

6. Fault current limiter according to claim 1, wherein the first cooling medium and the second cooling medium are kept at equal conditions with respect to pressure and temperature.

7. Fault current limiter according to claim 1, wherein the insulation housing includes at least one docking site suitable for coupling the insulating housing to at least a further insulation housing.

8. Fault current limiter according to claim 1, wherein the interior of successive insulation housings are physically connected by a compensation tube.

9. Fault current limiter according to claim 1, wherein at least one conduit is connected with the first cooling medium circuit for allowing discharge of gaseous cooling medium.

10. Current limiting unit comprising:
    one or more superconducting elements and current supplies for electrically connecting the superconducting elements to further current limiting units and/or to an external grit, wherein the current limiting unit forms a casing which spatially separates the superconducting elements from the surrounding wherein the one or more superconducting elements are electrically connected to current supply tubes which serve to feed and discharge cooling medium to the fault current limiting unit.

11. Current limiting unit according to claim 10, wherein the casing is formed by a shielding electrode and wherein an optionally left open face is closed by a cover.

12. Current limiting unit according to claim 10, wherein the current supplies have a tubular shape for simultaneously feeding and discharging cooling medium to the interior of the current limiting units.

13. A method of making a fault current limiter, said method comprising the steps of:

employing an insulation housing and/or a current limiting unit as defined in claim 1 in the modular design of said fault current limiter.

* * * * *